(12) United States Patent
Ning

(10) Patent No.: US 9,502,436 B2
(45) Date of Patent: Nov. 22, 2016

(54) THIN FILM TRANSISTOR, ARRAY SUBSTRATE AND METHOD FOR FABRICATING THE SAME, AND DISPLAY DEVICE

(71) Applicant: BOE TECHNOLOGY GROUP CO., LTD., Beijing (CN)

(72) Inventor: Ce Ning, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/408,049

(22) PCT Filed: Apr. 16, 2014

(86) PCT No.: PCT/CN2014/075487
§ 371 (c)(1),
(2) Date: Dec. 15, 2014

(87) PCT Pub. No.: WO2015/081650
PCT Pub. Date: Jun. 11, 2015

(65) Prior Publication Data
US 2015/0303222 A1 Oct. 22, 2015

(30) Foreign Application Priority Data
Dec. 2, 2013 (CN) .......................... 2013 1 0638289

(51) Int. Cl.
*H01L 27/12* (2006.01)
*H01L 29/417* (2006.01)
(Continued)

(52) U.S. Cl.
CPC ......... *H01L 27/1225* (2013.01); *G02F 1/1368* (2013.01); *G02F 1/136227* (2013.01);
(Continued)

(58) Field of Classification Search
CPC ........... H01L 27/1225; H01L 29/7869; H01L 29/66969
USPC ............................................ 257/43; 438/104
See application file for complete search history.

(56) References Cited

U.S. PATENT DOCUMENTS

2005/0242401 A1* 11/2005 Cho ................... G02F 1/136227
257/368
2007/0103610 A1* 5/2007 Lee ................... G02F 1/136213
349/38

(Continued)

FOREIGN PATENT DOCUMENTS

CN 1731562 A 2/2006
CN 1964056 A 5/2007

(Continued)

OTHER PUBLICATIONS

Search Report issued in International Application No. PCT/CN2014/075487, fifteen (15) pages.

(Continued)

*Primary Examiner* — Cuong Q Nguyen
*Assistant Examiner* — Tong-Ho Kim
(74) *Attorney, Agent, or Firm* — Nath, Goldberg & Meyer; Joshua B. Goldberg; Leonid D. Thenor

(57) ABSTRACT

A thin film transistor, an array substrate and a method for fabricating the array substrate, and a display device are disclosed. The thin film transistor comprises a gate electrode, a gate insulation layer, a semiconductor active layer, a source electrode, a drain electrode and a protection layer provided on a base substrate, and comprises: a first transparent electrode provided between the source electrode and the semiconductor active layer, corresponding to the source electrode and in direct contact with the source electrode; a second transparent electrode provided between the drain electrode and the semiconductor active layer, corresponding to the drain electrode and in direct contact with the drain electrode, the first transparent electrode is in contact with the semiconductor active layer through a first via provided in the protection layer, the second transparent electrode is in contact with the semiconductor active layer through a second via provided in the protection layer.

10 Claims, 12 Drawing Sheets

(51) Int. Cl.
  *H01L 29/49* (2006.01)
  *H01L 29/786* (2006.01)
  *H01L 29/45* (2006.01)
  *G02F 1/1368* (2006.01)
  *G02F 1/1362* (2006.01)

(52) U.S. Cl.
  CPC ........... *H01L27/12* (2013.01); *H01L 27/1248* (2013.01); *H01L 29/41733* (2013.01); *H01L 29/41758* (2013.01); *H01L 29/45* (2013.01); *H01L 29/4908* (2013.01); *H01L 29/4966* (2013.01); *H01L 29/786* (2013.01); *H01L 29/7869* (2013.01); *G02F 2001/13629* (2013.01)

(56) References Cited

U.S. PATENT DOCUMENTS

| | | | |
|---|---|---|---|
| 2009/0295701 A1* | 12/2009 | Matsumoto | H01L 27/124 345/92 |
| 2011/0018000 A1 | 1/2011 | Choi et al. | |
| 2013/0270526 A1* | 10/2013 | Kim | H01L 27/1218 257/40 |
| 2014/0049740 A1* | 2/2014 | Xu | G02F 1/134363 349/141 |
| 2014/0070206 A1* | 3/2014 | Dai | H01L 29/66969 257/43 |
| 2014/0167031 A1* | 6/2014 | Choi | H01L 21/02565 257/43 |

FOREIGN PATENT DOCUMENTS

| | | |
|---|---|---|
| CN | 203179888 U | 9/2013 |
| CN | 103646966 A | 3/2014 |
| JP | 2007052390 A | 3/2007 |

OTHER PUBLICATIONS

1st office action issued in Chinese application No. 201310638289.5 dated Oct. 29, 2015.

English translation of Written Opinion of PCT/CN2014/075487 from ISR dated Aug. 7, 2014 that was originally provided to the USPTO on Dec. 15, 2014 with the application.

* cited by examiner

THIN FILM TRANSISTOR, ARRAY SUBSTRATE AND METHOD FOR FABRICATING THE SAME, AND DISPLAY DEVICE

FIELD OF THE INVENTION

The present invention relates to the field of display technology, and more particularly, to a thin film transistor, an array substrate and a method for fabricating the array substrate, and a display device.

BACKGROUND OF THE INVENTION

In the field of display technology represented by liquid crystal displays (referred to as LCDs), due to improved resolution, increased display size and low resistance wiring required in integrating driver circuits in a display device, wires and electrodes, such as gate lines, and data lines as well as gate electrodes, source electrodes and drain electrodes in thin film transistors (referred to as TFTs), which are made of metal with low resistance characteristics (e.g., copper) have already been applied to the display devices. However, when this kind of metal (e.g., copper) is used for wiring or serves as an electrode, the metal is likely to diffuse into adjacent circuit elements or semiconductor layer in the thin film transistor, resulting in deterioration of performance of pixel elements or thin film transistors. Therefore, the metal atoms (e.g., copper atoms) contained in the wires or electrodes need to be prevented from spreading around or diffusing into the adjacent elements or semiconductor layer.

SUMMARY OF THE INVENTION

The embodiments of the present invention provide a thin film transistor, an array substrate and a method for fabricating the array substrate, and a display device, which may prevent diffusion of metal atoms so as to ensure performance of a thin film transistor, and avoid increment of numbers of patterning processes.

To achieve the above object, the embodiments of the present invention utilize following technical solutions.

As one aspect, there is provided a thin film transistor, comprising a gate electrode, a gate insulation layer, a semiconductor active layer, a source electrode, a drain electrode and a protection layer which are provided on a base substrate, the thin film transistor further comprises: a first transparent electrode that is provided between the source electrode and the semiconductor active layer, corresponds to the source electrode and is in direct contact with the source electrode; and a second transparent electrode that is provided between the drain electrode and the semiconductor active layer, corresponds to the drain electrode and is in direct contact with the drain electrode, wherein the first transparent electrode is in contact with the semiconductor active layer through a first via provided in the protection layer, and the second transparent electrode is in contact with the semiconductor active layer through a second via provided in the protection layer.

Optionally, the semiconductor active layer is a metal oxide semiconductor active layer.

Optionally, the metal oxide semiconductor active layer is provided close to the base substrate, the gate insulation layer and the gate electrode are sequentially provided on the metal oxide semiconductor active layer, a projection area of the gate insulation layer on the base substrate is smaller than that of the metal oxide semiconductor active layer on the base substrate, the first transparent electrode and the second transparent electrode are in contact with portions of the metal oxide semiconductor active layer exposed by the first via and the second via, respectively.

Preferably, the thin film transistor further comprises a third transparent electrode provided between the gate insulation layer and the gate electrode.

Optionally, the first transparent electrode and the second transparent electrode comprise at least one of indium tin oxide, indium zinc oxide and aluminum zinc oxide.

As another aspect, there is provided an array substrate, comprising thin film transistors and pixel electrodes electrically connected to drain electrodes of the thin film transistors, each thin film transistor is the thin film transistor described above.

Optionally, each pixel electrode comprises the second transparent electrode of the thin film transistor and a fourth transparent electrode provided on the same layer as the second transparent electrode and electrically connected to the second transparent electrode.

Further optionally, the array substrate further comprises a common electrode, the common electrode and the third transparent electrode of the thin film transistor are formed by one patterning process.

Further optionally, the common electrode comprises a plate-shaped electrode, the fourth transparent electrode comprises a plurality of electrically connected strip-shaped electrodes.

As yet another aspect, there is provided a display device, comprising the array substrate described above.

As still another aspect, there is provided a method for fabricating an array substrate, comprising steps of: forming a gate electrode, a gate insulation layer and a semiconductor active layer on a base substrate; forming a protection layer comprising a first via and a second via on the substrate on which the gate electrode, the gate insulation layer and the semiconductor active layer are formed, the first via and the second via exposing a portion of the semiconductor active layer; forming, on the substrate on which the protection layer is formed, a first transparent electrode, a second transparent electrode, a fourth transparent electrode electrically connected to the second transparent electrode, a source electrode corresponding to and in direct contact with the first transparent electrode and a drain electrode corresponding to and in direct contract with the second transparent electrode, by one patterning process, the second transparent electrode and the fourth transparent electrode constituting a pixel electrode, wherein the first transparent electrode is provided under the source electrode, and the first transparent electrode is in contact with the semiconductor active layer through the first via in the protection layer, the second transparent electrode is provided under the drain electrode, and the second transparent electrode is in contact with the semiconductor active layer through the second via in the protection layer.

Optionally, the step of forming the gate electrode, the gate insulation layer and the semiconductor active layer on the base substrate comprises steps of: forming a metal oxide semiconductor active layer and the gate insulation layer provided on the metal oxide semiconductor active layer on the base substrate by one patterning process; forming the gate electrode on the substrate on which the gate insulation layer is formed, by one patterning process, wherein a projection area of the gate insulation layer on the base substrate is smaller than that of the metal oxide semiconductor active layer on the base substrate.

Optionally, the method further comprises a step of forming a third transparent electrode between the gate insulation layer and the gate electrode.

Further optionally, the method further comprises forming a common electrode while forming the third transparent electrode, wherein the third transparent electrode and the common electrode are formed by one patterning process.

Optionally, the first transparent electrode, the second transparent electrode, the fourth transparent electrode, the source electrode and the drain electrode are formed in one patterning process by using a half-tone mask or a gray-tone mask.

The embodiments of the present invention provide a thin film transistor, an array substrate and a method for fabricating the array substrate, and a display device. The thin film transistor comprises a gate electrode, a gate insulation layer, a semiconductor active layer, a source electrode, a drain electrode and a protection layer which are provided on a base substrate, the thin film transistor further comprises: a first transparent electrode that is provided between the source electrode and the semiconductor active layer, corresponds to the source electrode and is in direct contact with the source electrode; and a second transparent electrode that is provided between the drain electrode and the semiconductor active layer, corresponds to the drain electrode and is in direct contact with the drain electrode, wherein the first transparent electrode is in contact with the semiconductor active layer through a first via provided in the protection layer, and the second transparent electrode is in contact with the semiconductor active layer through a second via provided in the protection layer.

Since the first transparent electrode is provided between the source electrode and the semiconductor active layer and the second transparent electrode is provided between the drain electrode and the semiconductor active layer, and the first and second transparent electrodes function as a conductive spacer layer. Therefore, when metal atoms (e.g., copper atoms) in the source metal electrode and the drain metal electrode diffuse, they diffuse into the first transparent electrode and the second transparent electrode, rather than diffusing into the semiconductor active layer. That is, the first transparent electrode and the second transparent electrode stop copper atoms from diffusing into the semiconductor active layer, which may prevent deterioration of performance of the semiconductor active layer, so that performance of the thin film transistor is ensured. In addition, during fabrication of an array substrate comprising the thin film transistor, since the first transparent electrode, the second transparent electrode, the source electrode and the drain electrode are formed by one patterning process, increment in numbers of the patterning processes can be avoided.

BRIEF DESCRIPTION OF THE DRAWINGS

In order to more clearly illustrate the technical solutions in the embodiments of the present invention, the accompanying drawings to be used in description of the embodiments will be briefly described herein. Apparently, the accompanying drawings in the following description are only some embodiments of the present invention, and other drawings may be obtained by a person skilled in the art based on these accompanying drawings without creative efforts.

DESCRIPTION OF THE PREFERRED EMBODIMENT

Hereinafter, the technical solutions in the embodiments of the present invention will be described clearly and completely with reference to the accompanying drawings in the embodiments. Obviously, the described embodiments are only a part but not all of the embodiments of the present invention. All other embodiments obtained by a person skilled in the art without creative efforts fall within the protection scope of the present invention.

Figure 1A:
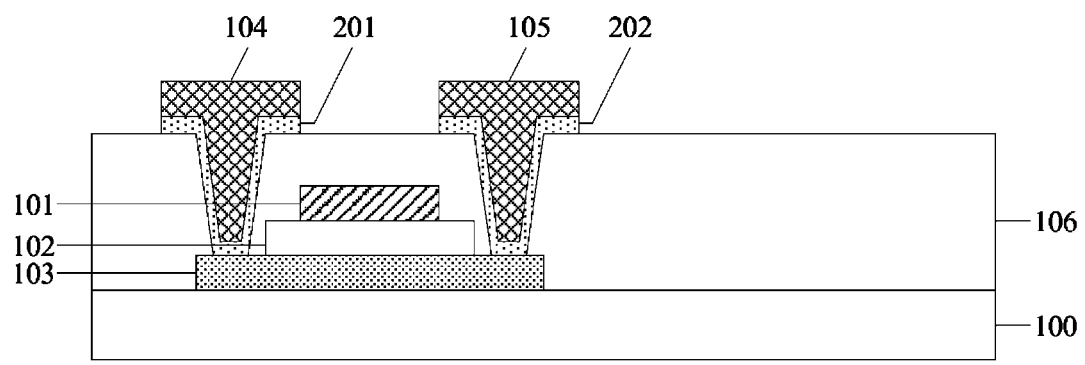
FIG. 1(a) is a schematic diagram of a structure of a first top-gate type thin film transistor according to an embodiment of the present invention.
Figure 1B:
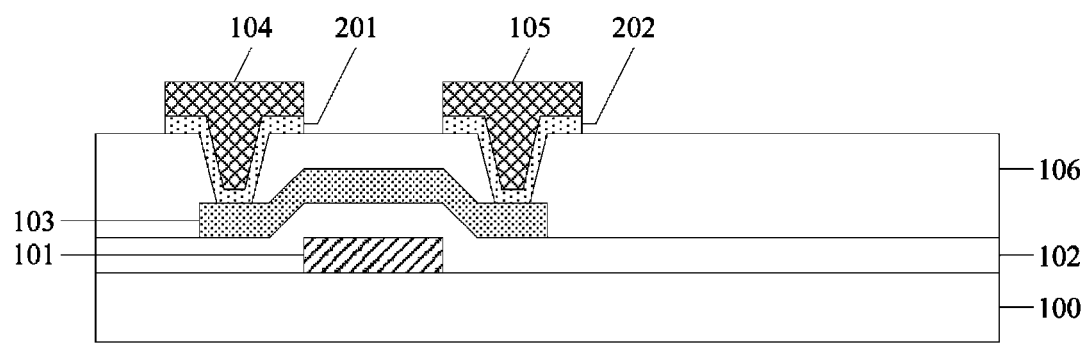
FIG. 1(b) is a schematic diagram of a structure of a first bottom-gate type thin film transistor according to an embodiment of the present invention.

The embodiments of the present invention provide a thin film transistor, which, as shown in FIGS. 1(a) and 1(b), comprises a gate electrode 101, a gate insulation layer 102, a semiconductor active layer 103, a source electrode 104, a drain electrode 105 and a protection layer 106 which are provided on a base substrate 100. The thin film transistor further comprises: a first transparent electrode 201 that is provided between the source electrode 104 and the semiconductor active layer 103, corresponds to the source electrode 104 and is in direct contact with the source electrode 104; and a second transparent electrode 202 that is provided between the drain electrode 105 and the semiconductor active layer 103, corresponds to the drain electrode 105 and is in direct contact with the drain electrode 105.

In the thin film transistor, the first transparent electrode 201 is in contact with the semiconductor active layer 103 through a first via provided in the protection layer 106, and the second transparent electrode 202 is in contact with the semiconductor active layer 103 through a second via provided in the protection layer 106.

Here, in order to satisfy requirements on high resolution and large display size of the display device, the embodiments of the present invention preferably utilize copper with low resistance as electrode material of the source electrode 104 and the drain electrode 105.

It should be noted that, firstly, since copper is a metal material which easily diffuses, if copper atoms in the copper electrode diffuse into the adjacent semiconductor active layer 103, performance of the semiconductor active layer 103 may be deteriorated. Therefore, in the embodiments of the present invention, the first transparent electrode 201 is provided between the source electrode 104 and the semiconductor active layer 103, and the second transparent electrode 202 is provided between the drain electrode 105 and the semiconductor active layer 103, so that the source electrode 104 and the semiconductor active layer 103 are separated from each other, and the drain electrode 105 and the semiconductor active layer 103 are separated from each other, thereby preventing performance of the semiconductor active layer 103 from being deteriorated due to diffusion of copper.

The first transparent electrode 201 and the second transparent electrode 202 may be made of at least one of transparent conductive oxide materials such as indium tin oxide (ITO), indium zinc oxide (IZO), and aluminum zinc oxide (AZO).

Obviously, the source electrode 104 and the drain electrode 105 in the embodiments of the present invention may utilize other metal material as the electrode material, as long as electrical conductivity of the utilized metal material can satisfy requirement on performance of the device to which the thin film transistor is applied. In addition, the structure of the thin film transistor provided by the embodiments of the present invention can prevent deterioration of performance of the semiconductor active layer 103 due to diffusion of copper atoms contained in the metal electrode material.

Further, the gate electrode 101 may utilize the same material as the source electrode 104 and the drain electrode 105, which is not limited herein.

Secondly, the type of the thin film transistor is not limited herein, it may be a top-gate type, or may be a bottom-gate type.

Thirdly, the material of the semiconductor active layer 103 may be amorphous silicon, or may be metal oxide semiconductor, which is not limited herein.

When the material of the semiconductor active layer 103 is amorphous silicon, since the amorphous silicon has photosensitivity in the visible light range, if the semiconductor active layer 103 made of the amorphous silicon is directly provided on the base substrate 100, performance of the semiconductor active layer 103 may be changed under irradiation of the visible light. Therefore, a non-transparent film layer is required to be provided between the semiconductor active layer 103 made of the amorphous silicon and the base substrate 100 so as to block light, but this may increase complexity of fabricating process of the thin film transistor, and reduces reliability and aperture ratio.

The embodiments of the present invention provide a thin film transistor, which, as shown in FIGS. 1(a) and 1(b), comprises a gate electrode 101, a gate insulation layer 102, a semiconductor active layer 103, a source electrode 104, a drain electrode 105 and a protection layer 106 which are provided on a base substrate 100. The thin film transistor further comprises: a first transparent electrode 201 that is provided between the source electrode 104 and the semiconductor active layer 103, corresponds to the source electrode 104 and is in direct contact with the source electrode 104; and a second transparent electrode 202 that is provided between the drain electrode 105 and the semiconductor active layer 103, corresponds to the drain electrode 105 and is in direct contact with the drain electrode 105. In the thin film transistor, the first transparent electrode 201 is in contact with the semiconductor active layer 103 through a first via provided in the protection layer 106, and the second transparent electrode 202 is in contact with the semiconductor active layer 103 through a second via provided in the protection layer 106.

It can be seen from the above description that, the first transparent electrode 201 provided between the source electrode 104 and the semiconductor active layer 103 and the second transparent electrode 202 provided between the drain electrode 105 and the semiconductor active layer 103 may be equivalent to a conductive spacer layer. In one aspect, since the first transparent electrode 201 and the second transparent electrode 202 are both made of a conductive material, electrical connections between the source electrode 104 and the semiconductor active layer 103 and between the drain electrode 105 and the semiconductor active layer 103 are still maintained. In another aspect, in a case where the source electrode 104 and the drain electrode 105 both utilize metal electrodes (e.g., copper electrodes), if copper atoms in the copper electrodes diffuse, they diffuse into the first transparent electrode 201 or the second transparent electrode 202, rather than diffusing into the semiconductor active layer 103. That is, the first transparent electrode 201 and the second transparent electrode 202 stop the copper atoms from diffusing into the semiconductor active layer 103, which can prevent deterioration of performance of the semiconductor active layer 103.

In consideration of advantages of high mobility, good uniformity, transparency and simple fabricating process of the thin film transistor comprising the metal oxide semiconductor active layer, in the embodiments of the present invention, the semiconductor active layer 103 is preferably configured to be a metal oxide semiconductor active layer 103. The metal oxide semiconductor active layer 103 preferably utilizes at least one of transparent metal oxide semiconductor materials such as indium gallium zinc oxide (referred to as IGZO), indium tin zinc oxide (referred to as ITZO), indium oxide ($In_2O_3$) and zinc oxide (ZnO).

In addition, optionally, referring to FIG. 1(a), the metal oxide semiconductor active layer 103 is provided close to the base substrate 100, the gate insulation layer 102 and the gate electrode 101 are sequentially provided on the metal oxide semiconductor active layer 103. A projection area of the gate insulation layer 102 on the base substrate 100 is smaller than that of the metal oxide semiconductor active layer 103 on the base substrate 100, the first transparent electrode 201 and the second transparent electrode 202 are in contact with portions of the metal oxide semiconductor active layer 103 exposed by the first via and the second via in the protection layer 106, respectively, and the source electrode 104 and the drain electrode 105 are formed on the first transparent electrode 201 and the second transparent electrode 202, respectively.

Here, the reason why the projection area of the gate insulation layer 102 on the base substrate 100 is smaller than that of the metal oxide semiconductor active layer 103 on the base substrate 100 is to expose left and right sides of the metal oxide semiconductor active layer 103, so that the first transparent electrode 201 and the second transparent electrode 202 are in contact with the metal oxide semiconductor active layer 103 through the first via and the second via provided in the protection layer 106, respectively.

FIG. 1(a) illustrates an example of a top-gate type thin film transistor according to an embodiment of the present invention. However, the present invention is not limited thereto. The present invention may also be applicable to a bottom-gate type thin film transistor, for example, as shown in FIG. (b). Specifically, referring to FIG. 1(b), the gate electrode 101 is provided close to the base substrate 100, the gate insulation layer 102 and the metal oxide semiconductor active layer 103 are sequentially provided on the gate electrode 101. The first transparent electrode 201 and the second transparent electrode 202 are in contact with portions of the metal oxide semiconductor active layer 103 exposed by the first via and the second via in the protection layer 106, respectively, and the source electrode 104 and the drain electrode 105 are formed on the first transparent electrode 201 and the second transparent electrode 202, respectively.

In practical application, in addition to the fact that the metal atoms (e.g., copper atoms) in the source electrode 104 and the drain electrode 105 may diffuse into the semiconductor active layer 103 to influence the performance of the thin film transistor, the metal atoms in the gate electrode 101 may also diffuse into the gate insulation layer 102 to influence the performance of the thin film transistor. Therefore, preferably, as shown in FIGS. 2(a) and 2(b), the thin film transistor may further comprise a third transparent electrode 203 provided between the gate insulation layer 102 and the gate electrode 101.

The third transparent electrode 203 may utilize at least one of transparent conductive oxide materials such as ITO, IZO and AZO.

As such, when the metal atoms (e.g., copper atoms) in the gate electrode 101 diffuse, the third transparent electrode 203 provided between the gate electrode 101 and the gate insulation layer 102 may stop the copper atoms from entering into the gate insulation layer 102, thus change of performance of the gate insulation layer 102 due to diffusion of the metal atoms may be prevented, and performance of the thin film transistor is ensured.

Figure 2A:
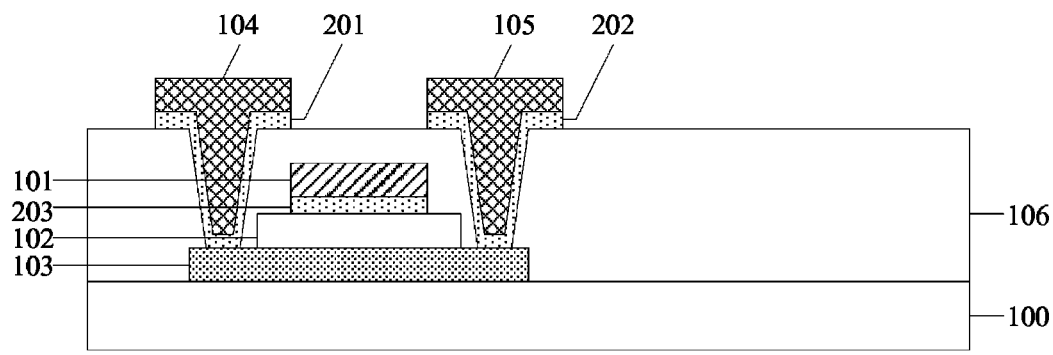
FIG. 2(a) is a schematic diagram of a structure of a second top-gate type thin film transistor according to an embodiment of the present invention.
Figure 2B:
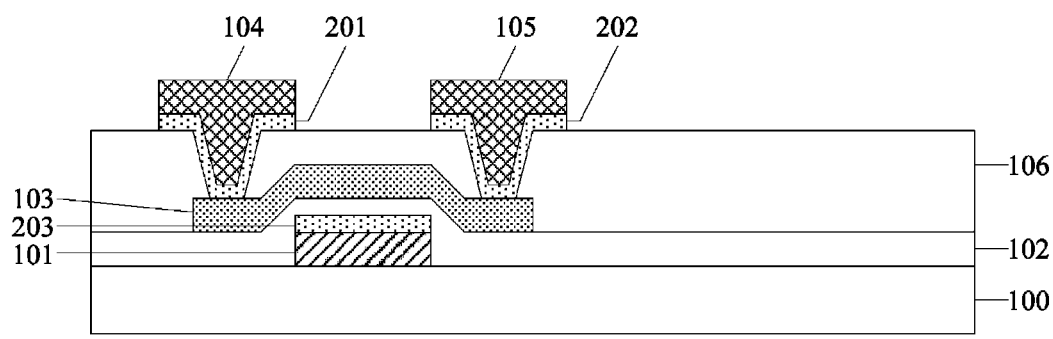
FIG. 2(b) is a schematic diagram of a structure of a second bottom-gate type thin film transistor according to an embodiment of the present invention.
Figure 3A:
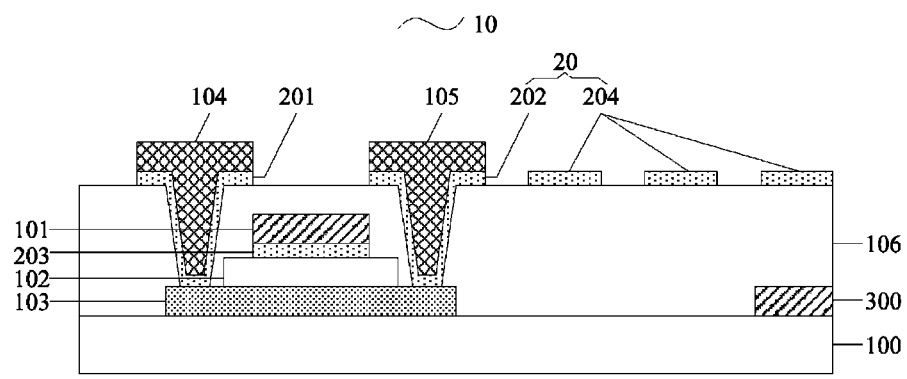
FIG. 3(a) is a schematic diagram of a structure of a first twisted nematic type array substrate according to an embodiment of the present invention.
Figure 3B:
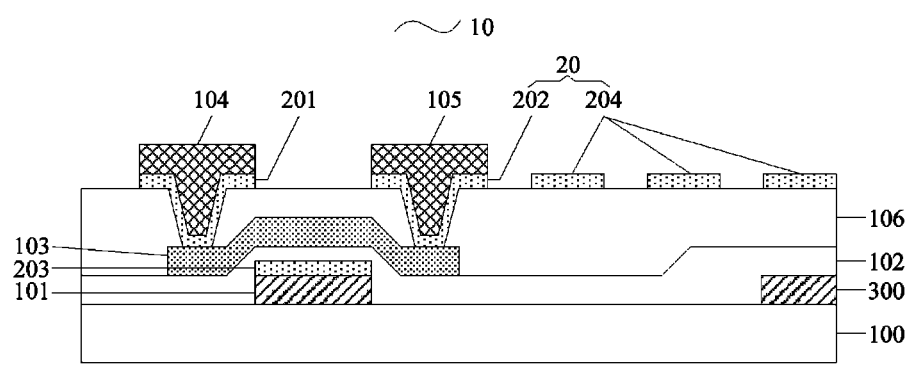
FIG. 3(b) is a schematic diagram of a structure of a second twisted nematic type array substrate according to an embodiment of the present invention.

The embodiments of the present invention also provide an array substrate 10, which, as shown in FIG. 3(a) or 3(b), comprises the thin film transistor shown in FIG. 2(a) or 2(b) and a pixel electrode 20 electrically connected to the drain electrode 105 of the thin film transistor.

In this case, the array substrate 10 is a twisted nematic type array substrate, and the pixel electrode 20 may be a strip-shaped electrode or a plate-shaped electrode.

Preferably, referring to FIGS. 3(a) and 3(b), the pixel electrode 20 may comprise the second transparent electrode 202 of the thin film transistor and a fourth transparent electrode 204 provided on the same layer as the second transparent electrode 202 and electrically connected to the second transparent electrode 202.

Here, the first transparent electrode 201, the second transparent electrode 202 and the fourth transparent electrode 204 are provided on the same layer, and have the same material. That is, the first transparent electrode 201, the second transparent electrode 202 and the fourth transparent electrode 204 may be formed by one patterning process. As such, not only the first transparent electrode 201 and the second transparent electrode 202 for stopping the metal atoms in the source electrode 104 and the drain electrode 105 of the thin film transistor from diffusing into the metal oxide semiconductor active layer 103 are formed, but also the fourth transparent electrode 204 electrically connected to the second transparent electrode 202 is formed, and by connecting the fourth transparent electrode 204 to the drain electrode 105, the second transparent electrode 202 and the fourth transparent electrode 204 together constitute the pixel electrode 20.

Figure 4A:
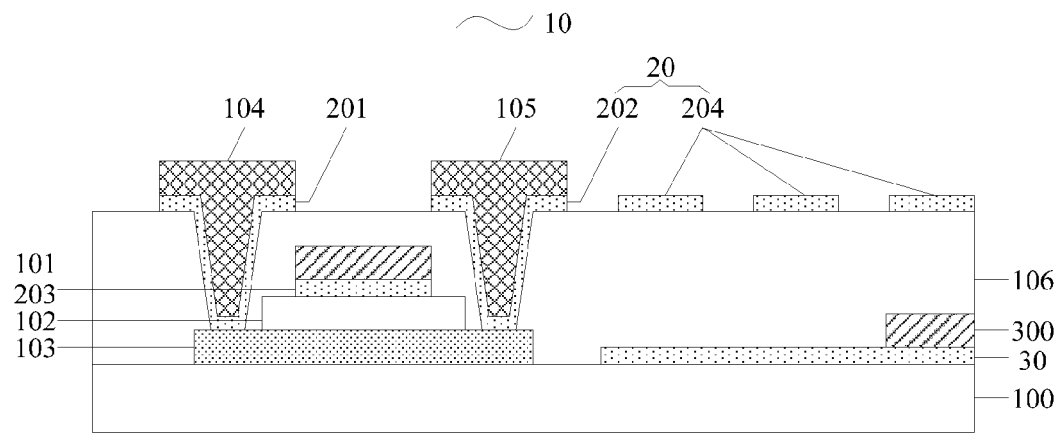
FIG. 4(a) is a schematic diagram of a structure of a first advanced super dimension switch type array substrate according to an embodiment of the present invention.
Figure 4B:
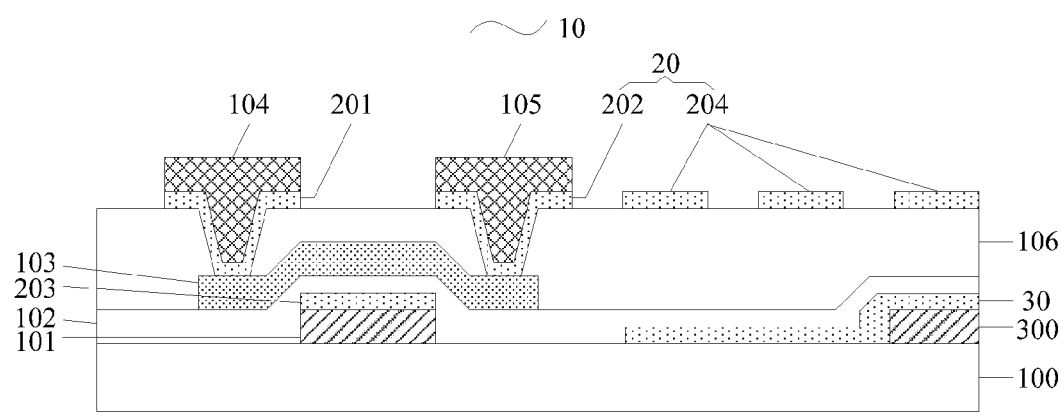
FIG. 4(b) is a schematic diagram of a structure of a second advanced super dimension switch type array substrate according to an embodiment of the present invention.

In addition, as shown in FIGS. 4(a) and 4(b), the array substrate 10 may further comprise a common electrode 30.

In a case where the thin film transistor comprises the third transparent electrode 203, preferably, the common electrode 30 and the third transparent electrode 203 of the thin film transistor may be formed by one patterning process. Of course, the gate electrode 101 and the common electrode line 300 electrically connected to the common electrode 30 may also be formed by one patterning process.

In a case where the array substrate 10 is an advanced super dimension switch type array substrate, the common electrode 30 and the pixel electrode 20 are both provided on the array substrate 10, multi-dimensional electric field is formed by the electric fields generated between the slit-shaped electrodes and the plate-shaped electrode, so that liquid crystal molecules of all orientations in the liquid crystal cell can be rotated, thereby improving work efficiency of the liquid crystal and increasing light transmission efficiency. The advanced super dimension switch technology can improve picture quality of the display panel, and has advantages of high resolution, high transmittance, low power consumption, wide viewing angle, high aperture ratio, low chromatic aberration, no push Mura, and the like.

The common electrode 30 and the third transparent electrode 203 are formed by one patterning process, the pixel electrode 20, the first transparent electrode 201 and the second transparent electrode 202 are formed by one patterning, and the first transparent electrode 201 and the second transparent electrode 202 are provided above the third transparent electrode 203, and therefore, in the embodiments of the present invention, the pixel electrode 20 is provided above the common electrode 30. In this case, the pixel electrode 20 is the strip-shaped electrode, and the common electrode 30 is the plate-shaped electrode; and in this case, the fourth transparent electrode 204 may comprise a plurality of electrically connected strip-shaped electrodes.

The embodiments of the present invention also provide a display device, comprising the above array substrate 10.

The display device provided by the embodiments of the present invention may be any product or component with display function, such as liquid crystal panel, liquid crystal TV, liquid crystal display, digital photo frame, cell phone, tablet PC, etc.

Figure 5A:
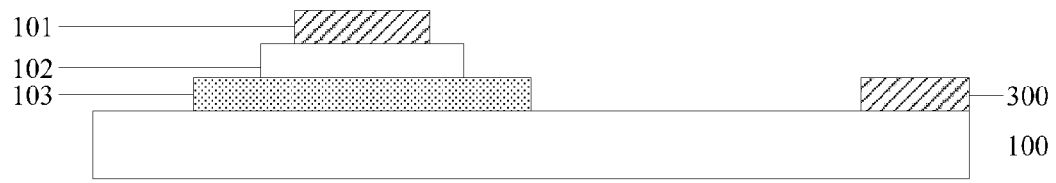
FIGS. 5(a) through 5(c) are schematic diagrams of processes of a first method for forming an array substrate according to an embodiment of the present invention.
Figure 5B:
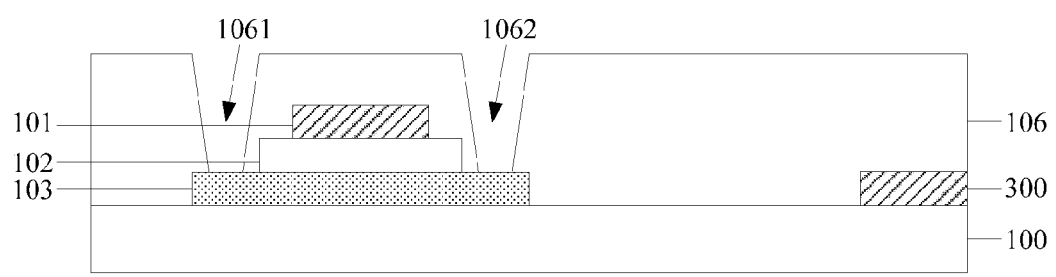
Figure 5C:
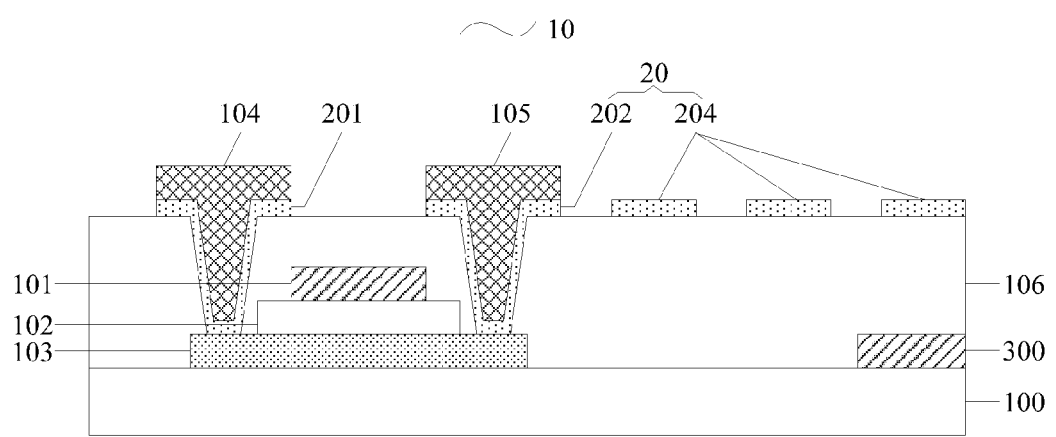
Figure 6A:
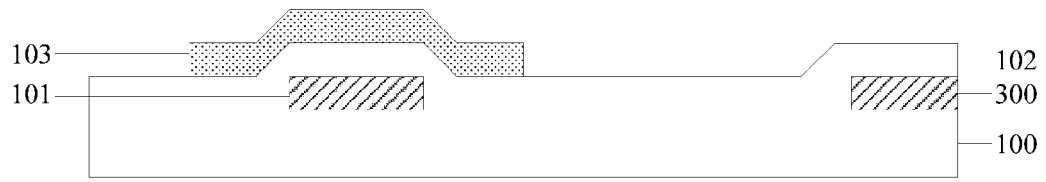
FIGS. 6(a) through 6(c) are schematic diagrams of processes of a second method for forming an array substrate according to an embodiment of the present invention.
Figure 6B:
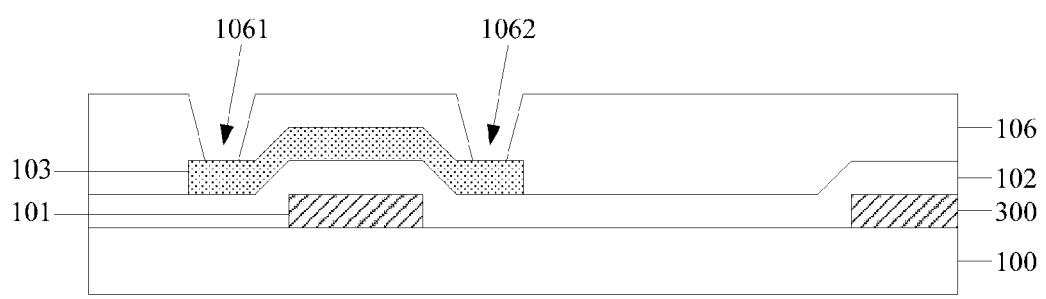
Figure 6C:
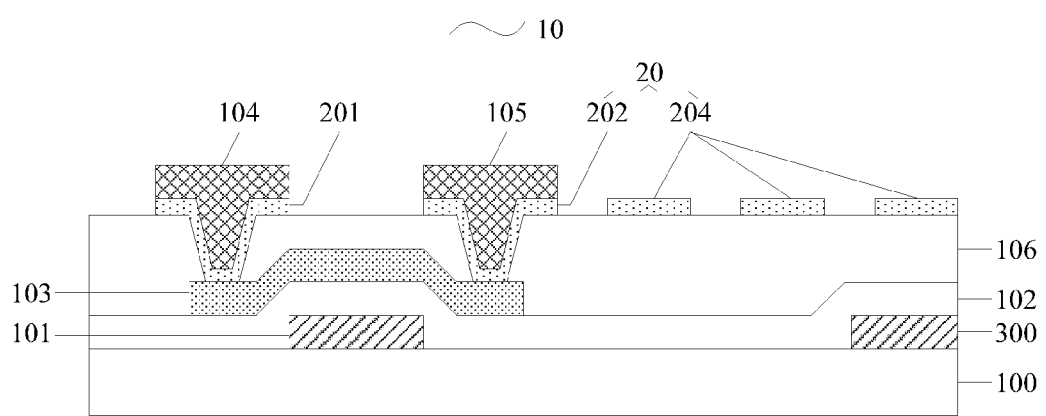

The embodiments of the present invention also provide a method for fabricating the array substrate 10, and the method comprises steps of: forming a gate electrode 101, a gate insulation layer 102 and a semiconductor active layer 103 on the base substrate 100, as shown in FIGS. 5(a) and 6(a); forming a protection layer 106 comprising a first via 1061 and a second via 1062 on the substrate on which the gate electrode 101, the gate insulation layer 102 and the semiconductor active layer 103 are formed, as shown in FIGS. 5(b) and 6(b), the first via 1061 and the second via 1062 exposing portions of the semiconductor active layer 103; forming, on the substrate on which the protection layer 106 is formed, a first transparent electrode 201, a second transparent electrode 202, a fourth transparent electrode 204 electrically connected to the second transparent electrode 202, a source electrode 104 corresponding to and in direct contact with the first transparent electrode 201, and a drain electrode 105 corresponding to and in direct contact with the second transparent electrode 202, by one patterning process, the second transparent electrode 202 and the fourth transparent electrode 204 constituting a pixel electrode 20.

In the array substrate 10, the first transparent electrode 201 is provided under the source electrode 104, and the first transparent electrode 201 is in contact with the semiconductor active layer 103 through the first via 1061 in the protection layer 106. The second transparent electrode 202 is provided under the drain electrode 105, and the second transparent electrode 202 is in contact with the semiconductor active layer 103 through the second via 1062 in the protection layer 106.

Here, referring to FIG. 5(a), when the semiconductor active layer 103, the gate insulation layer 102 and the gate electrode 101 are sequentially formed on the base substrate 100, a top-gate structure may be formed. Alternatively, referring to FIG. 6(a), when the gate electrode 101, the gate insulation layer 102 and the semiconductor active layer 103 are sequentially formed on the base substrate 100, a bottom-gate structure may be formed. No matter whether the top-gate structure or the bottom-gate structure is formed, a common electrode line 300 may be formed while forming the gate electrode 101.

Further, in consideration of advantages of high mobility, good uniformity, transparency and simple fabricating process of the thin film transistor comprising the metal oxide semiconductor active layer, in the embodiments of the present invention, the semiconductor active layer 103 is preferably a metal oxide semiconductor active layer 103.

In addition, preferably, referring to FIGS. 4(a) and 4(b), the method may further comprise a step of forming a third transparent electrode 203 between the gate insulation layer 102 and the gate electrode 101.

The third transparent electrode 203 is used for stopping metal atoms in the gate electrode 101 from diffusing into the gate insulation layer 102, so as to ensure performance of the thin film transistor.

Further, referring to FIGS. 4(a) and 4(b), a common electrode 30 may be formed while forming the third transparent electrode 203; the common electrode 30 and the third transparent electrode 203 may be formed by one patterning process.

When fabricating the array substrate, in order to enable the array substrate to have good transmittance, generally, regions of the array substrate covered by the transparent electrodes have relatively large areas, and regions of the array substrate covered by the metal electrodes or metal wires have small areas. Therefore, referring to FIG. 4(a), when forming the array substrate, if the metal oxide semiconductor active layer 103 is provided below the gate electrode 101 with the gate insulation layer 102 provided therebetween, and the third transparent electrode 203 is provided between the gate insulation layer 102 and the gate electrode 101, then the third transparent electrode 203 is provided under the gate electrode 101, and the common electrode 30 is provided under the common electrode line 300. In this case, the third transparent electrode 203, the common electrode 30, the gate electrode 101 and the common electrode line 300 may be formed by only one patterning process. Alternatively, referring to FIG. 4(b), if the metal oxide semiconductor active layer 103 is provided above the gate electrode 101 with the gate insulation layer 102 provided therebetween, and the third transparent electrode 203 is provided between the gate insulation layer 102 and the gate electrode 101, then the third transparent electrode 203 is provided on the gate electrode 101, and the common electrode 30 is provided on the common electrode line 300. In this case, since the area of the common electrode 30 is larger than that of the common electrode line 300, the gate electrode 101 and the common electrode line 300 may be formed by one patterning process, and another one patterning process is required to form the third transparent electrode 203 and the common electrode 30.

In view of the above, the embodiments of the present invention preferably utilize the array substrate 10 with the top-gate structure shown in FIG. 4(a), i.e., the method comprises steps of: forming the metal oxide semiconductor active layer 103 and the gate insulation layer 102 provided on the metal oxide semiconductor active layer 103 on the base substrate 100 by one patterning process; forming the third transparent electrode 203, the common electrode 30, the gate electrode 101 provided on the third transparent electrode 203 and the common electrode line 300 provided on the common electrode 30 by one patterning process; then forming the protection layer 106 comprising the first via 1061 and the second via 1062 by one patterning process; and forming the first transparent electrode 201, the second transparent electrode 202, the fourth transparent electrode 204 electrically connected to the second transparent electrode 202, the source electrode 104 provided on the first transparent electrode 201 and the drain electrode 105 provided on the second transparent electrode 202 by one patterning process, the second transparent electrode 202 and the fourth transparent electrode 204 constituting the pixel electrode 20.

A projection area of the gate insulation layer 102 on the base substrate 100 is smaller than that of the metal oxide semiconductor active layer 103 on the base substrate 100, thus left and right sides of the metal oxide semiconductor active layer 103 may be exposed by the first via 1061 and the second via 1062, respectively, so that the first transparent electrode 201 and the second transparent electrode 202 may be respectively in contact with the metal oxide semiconductor active layer 103 through the first via 1061 and the second via 1062 in the subsequent process.

Hereinafter, the method for fabricating the array substrate 10 will be described by way of a specific embodiment.

Referring to FIG. 4(a), the array substrate 10 comprises: the metal oxide semiconductor active layer 103, the gate insulation layer 102, the third transparent electrode 203, the common electrode 30 formed together with the third transparent electrode 203, the gate electrode 101, the common electrode line 300 formed together with the gate electrode 101, the protection layer 106 comprising the first via 1061 and the second via 1062, the first transparent electrode 201, the second transparent electrode 202, the fourth transparent electrode 204 electrically connected to the second transparent electrode 202, the source electrode 104 corresponding to and in direct contact with the first transparent electrode 201 and the drain electrode 105 corresponding to and in direct contact with the second transparent electrode 202, which are sequentially formed on the base substrate 100.

In the array substrate 10, the projection area of the gate insulation layer 102 on the base substrate 100 is smaller than that of the metal oxide semiconductor active layer 103 on the base substrate 100, the first transparent electrode 201 is in contact with the metal oxide semiconductor active layer 103 through the first via 1061 provided in the protection layer 106, and the second transparent electrode 202 is in contact with the metal oxide semiconductor active layer 103 through the second via 1062 provided in the protection layer 106.

Specifically, the method for fabricating the array substrate 10 comprises following steps.

Figure 7A:
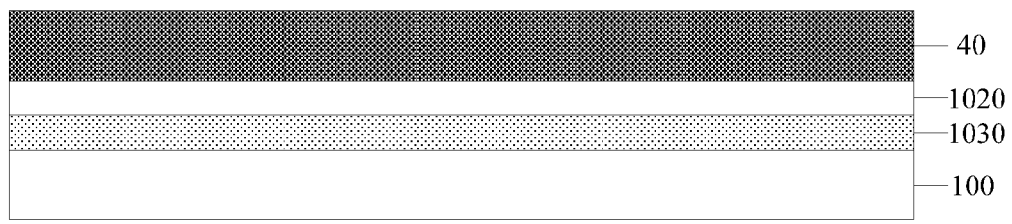
FIGS. 7(a) through 7(f) are schematic diagrams of processes of forming a metal oxide semiconductor active layer and a gate insulation layer according to an embodiment of the present invention.

In step S101, as shown in FIG. 7(a), a layer of metal oxide semiconductor film 1030 and a layer of insulation layer film 1020 are sequentially deposited on the base substrate 100, and a photoresist 40 is coated on the insulation layer film 1020.

Here, a layer of metal oxide semiconductor film 1030 with a thickness of 30 nm to 50 nm may be deposited by magnetron sputtering process, and a layer of insulation layer film 1020 with a thickness of 200 nm to 400 nm may be deposited by plasma enhanced chemical vapor deposition process.

In this step, the metal oxide semiconductor film 1030 may be made of at least one of transparent metal oxide semiconductor materials such as IGZO, ITZO, In$_2$O$_3$ and ZnO. The material of the insulation layer film 1020 is generally silicon nitride, or may utilize one or more of insulation materials such as silicon oxide, silicon oxynitride and aluminum oxide.

Figure 7B:
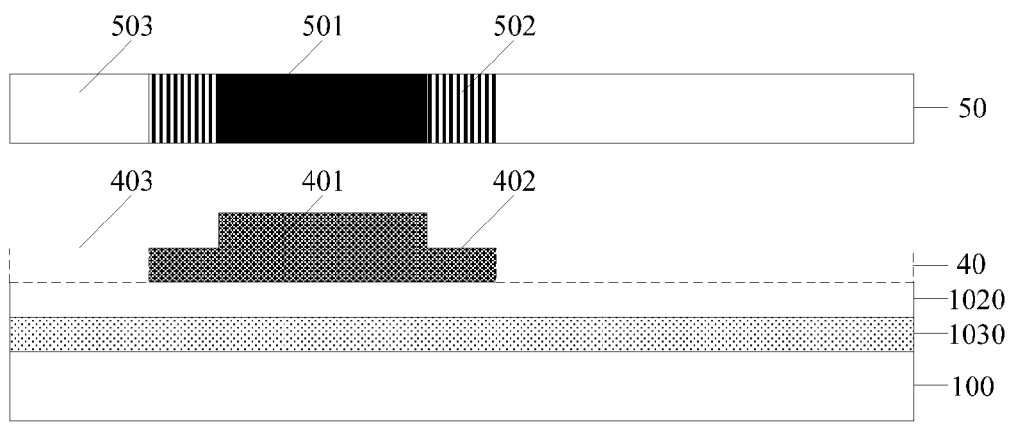

In step S102, as shown in FIG. 7(b), the substrate coated with the photoresist 40 is exposed by using a half-tone mask 50 or gray-tone mask and is then developed, to form a photoresist completely remaining portion 401, a photoresist half remaining portion 402 and a photoresist completely removed portion 403.

In this step, the photoresist completely remaining portion 401 corresponds to the region of the gate insulation layer 102, the photoresist half remaining portion 402 corresponds to the portion of the metal oxide semiconductor active layer 103 to be exposed by the first via 1061 and the second via 1062, and the photoresist completely removed portion 403 corresponds to other regions.

Here, the main principle of the half-tone mask 50 is described with reference to FIG. 7(b).

The half-tone mask 50 refers to a mask in which a non-transmissive light shielding metal layer is formed on a certain region of a transparent substrate, a semi-transmissive light shielding metal layer is formed on another region, and no light shielding metal layer is formed on the remaining region. In the mask, a thickness of the semi-transmissive light shielding metal layer is smaller than that of the non-transmissive light shielding metal layer. Based on this, transmittance of UV light through the semi-transmissive light shielding metal layer may be changed by adjusting the thickness of the semi-transmissive light shielding metal layer.

Based on the above description, the principle of the half-tone mask 50 is as follows: intensity of transmitted light at different exposed regions are made to be different by controlling the thickness of the light shielding metal layer at different regions of the half-tone mask 50, so that the photoresist completely remaining portion 401, the photoresist half remaining portion 402 and the photoresist completely removed portion 403 respectively corresponding to a completely non-transparent portion 501, a semi-transparent portion 502 and a completely transparent portion 503 of the half-tone mask 50 are formed after the photoresist 40 is selectively exposed and developed. As such, after a first etching, the film covered by the photoresist completely remaining portion 401 and the photoresist half remaining portion 402 remains. Then, since the thickness of the photoresist of the photoresist completely remaining portion 401 is larger than that of the photoresist of the half remaining portion 402, the photoresist 40 of the photoresist completely remaining portion 401 still exists after the photoresist 40 of the photoresist half remaining portion 402 is removed by ashing process, so that the film with an exposed portion may be selectively etched, and thus at least two different pattern layers are obtained.

The principle of the gray-tone mask is similar to that of the half-tone mask 50, and is omitted herein.

Here, the embodiment of the present invention is described by taking the positive photoresist 40 as an example, that is, in the half-tone mask 50, the region corresponding to the photoresist completely removed portion 403 is a completely exposed region, and material of the corresponding half-tone mask 50 is a light-transmissive material; the region corresponding to the photoresist half remaining portion 402 is a half exposed region, and material of the corresponding half-tone mask 50 is light semi-transmissive material; and the region corresponding to the photoresist completely remaining portion 401 is an unexposed region, and material of the corresponding half-tone mask 50 is light non-transmissive material. However, for a person skilled in the art, it should be understood that, a negative photoresist is also applicable for the embodiments of the present invention.

Figure 7C:
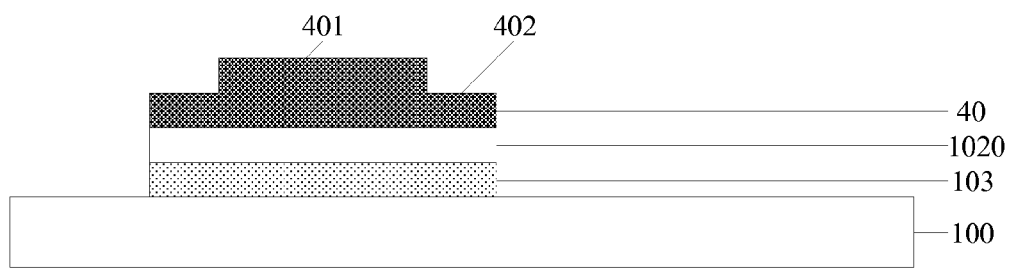

In step S103, as shown in FIG. 7(c), the insulation layer film 1020 and the metal oxide semiconductor film 1030 corresponding to the photoresist completely removed portion 403 are removed by etching process, to form the metal oxide semiconductor active layer 103.

Here, dry etching may be performed on the insulation layer film 1020, and wet etching may be performed on the metal oxide semiconductor film 1030, so as to form the metal oxide semiconductor active layer 103.

Figure 7D:
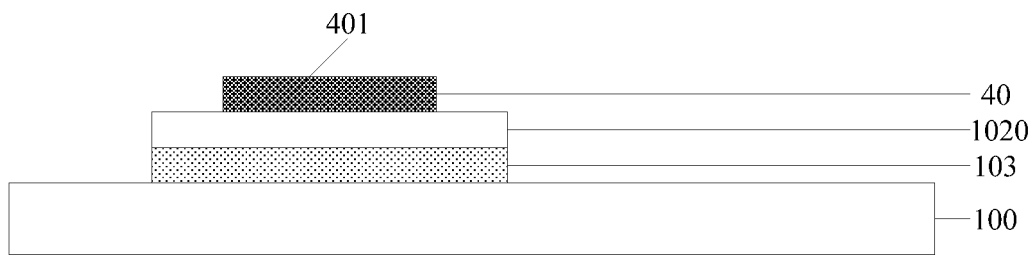

In step S104, as shown in FIG. 7(d), the photoresist 40 of the photoresist half remaining portion 402 is removed by ashing process.

At this time, the insulation layer film 1020 corresponding to the photoresist half remaining portion 402 is exposed.

Figure 7E:
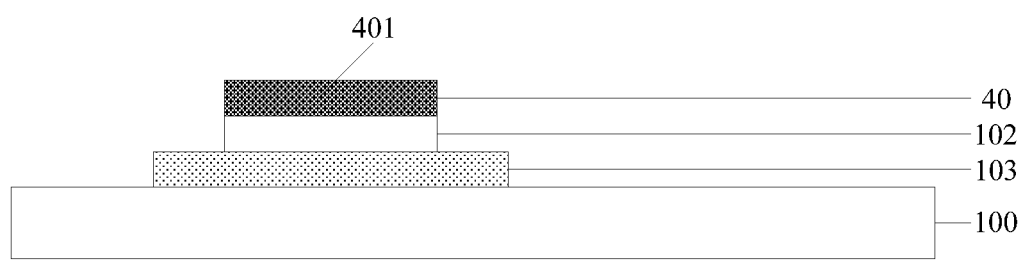

In step S105, as shown in FIG. 7(e), the exposed insulation layer film 1020 is removed by etching process, to form the gate insulation layer 102.

Here, dry etching may be performed on the insulation layer film 1020, so as to form the gate insulation layer 102.

Figure 7F:
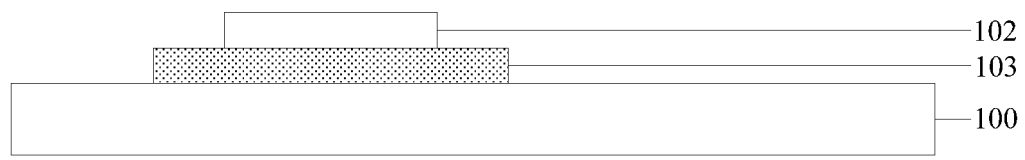

In step S106, as shown in FIG. 7(f), the photoresist 40 of the photoresist completely remaining portion 401 is removed by stripping process.

The above steps S101 to S106 are performed in one patterning process, to form the metal oxide semiconductor active layer 103 and the gate insulation layer 102.

Figure 8A:
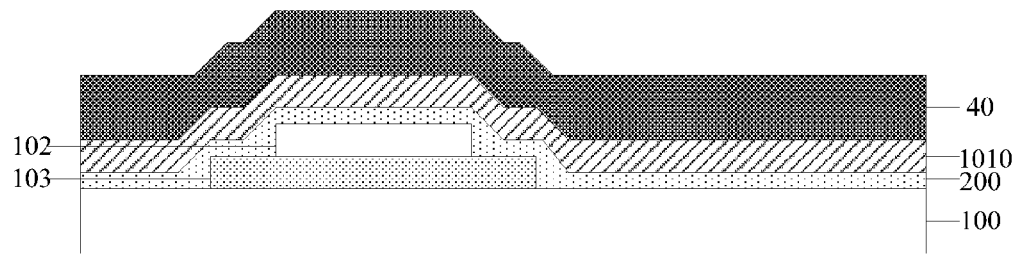
FIGS. 8(a) through 8(f) are schematic diagrams of processes of forming a gate electrode, a third transparent electrode and a common electrode according to an embodiment of the present invention.

In step S107, as shown in FIG. 8(a), a layer of transparent conductive film 200 and a layer of metal layer film 1010 are sequentially formed on the substrate on which the metal oxide semiconductor active layer 103 and the gate insulation layer 102 are formed, and the photoresist 40 is coated on the metal layer film 1010.

Here, a layer of transparent conductive film 200 with a thickness of 30 nm to 70 nm and a layer of metal layer film 1010 with a thickness of 200 nm to 300 nm may be sequentially deposited by magnetron sputtering process.

In this step, the transparent conductive film 200 may utilize at least one of transparent conductive oxide materials such as ITO, IZO and AZO, and material of the metal layer film 1010 is preferably copper or multi-layer structure of copper, or may be metal such as aluminum or molybdenum.

Figure 8B:
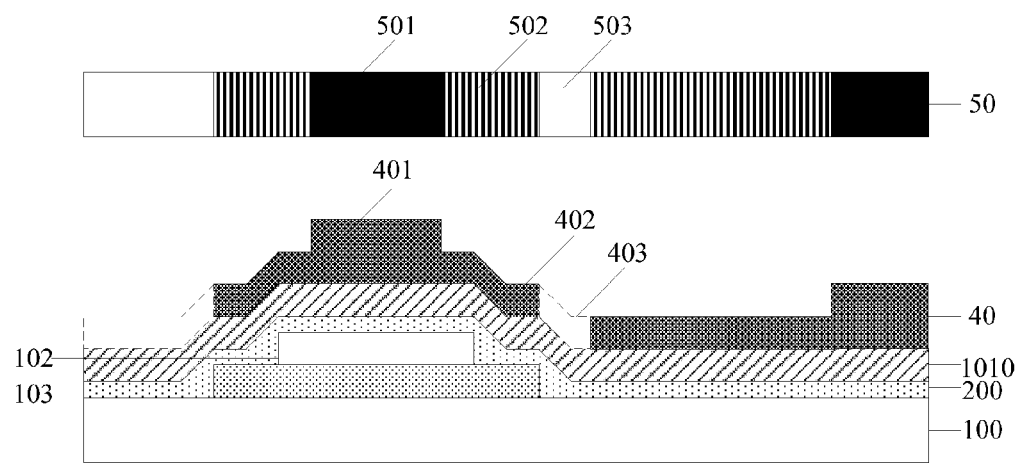

In step S108, as shown in FIG. 8(b), the substrate coated with the photoresist 40 is exposed by using a half-tone mask 50 or gray-tone mask and is then developed, to form a photoresist completely remaining portion 401, a photoresist half remaining portion 402 and a photoresist completely removed portion 403.

In this step, the photoresist completely remaining portion 401 corresponds to the regions of the third transparent electrode 203 and the gate electrode 101 provided on the third transparent electrode 203 as well as the region of the common electrode line 300; the photoresist half remaining portion 402 corresponds to the regions of the gate insulation layer 102 and the metal oxide semiconductor active layer 103 which are not covered by the third transparent electrode 203 and the gate electrode 101 as well as the region of the common electrode 30 which is not covered by the common electrode line 300; and the photoresist completely removed portion 403 corresponds to the other regions.

Figure 8C:
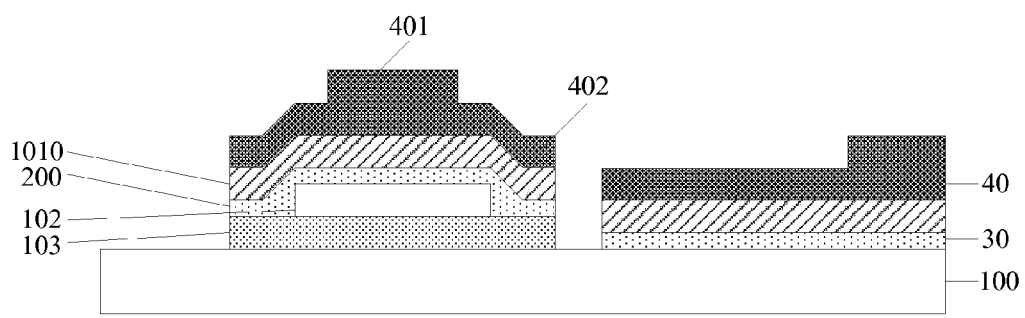

In step S109, as shown in FIG. 8(c), the metal layer film 1010 and the transparent conductive film 200 corresponding to the photoresist completely removed portion 403 are removed by etching process, so as to form the common electrode 30.

Here, wet etching may be performed on the metal layer film 1010 and the transparent conductive film 200.

Figure 8D:
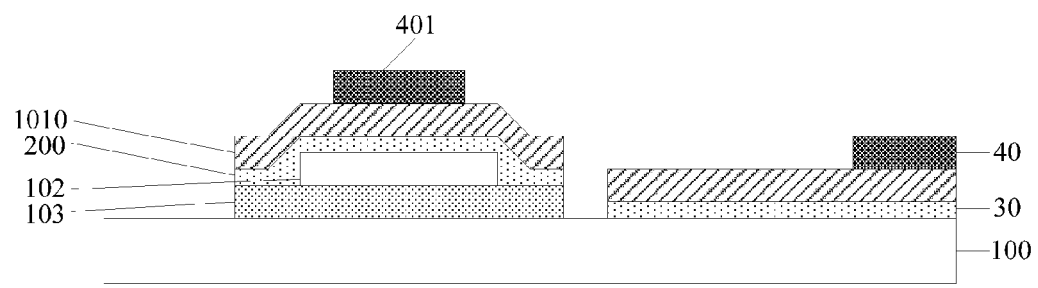

In step S110, as shown in FIG. 8(d), the photoresist 40 of the photoresist half remaining portion 402 is removed by ashing process.

At this point, the metal layer film 1010 corresponding to the photoresist half remaining portion 402 is exposed.

Figure 8E:
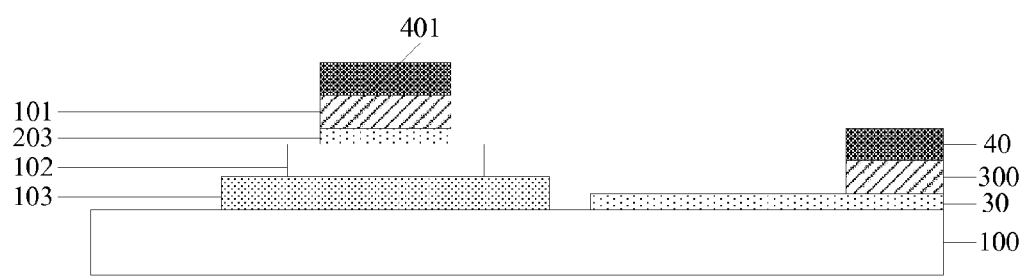

In step S111, as shown in FIG. 8(e), the exposed metal layer film 1010 and the corresponding transparent conductive film 200 provided under the metal layer film 1010 are removed by etching process, to form the gate electrode 101, the third transparent electrode 203 and the common electrode line 300.

Figure 8F:
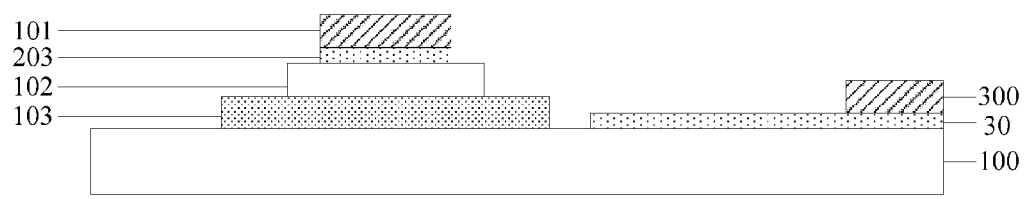

In step S112, as shown in FIG. 8(f), the photoresist 40 of the photoresist completely remaining portion 401 is removed by stripping process.

The above steps S107 to S112 are performed in one patterning process, to form the third transparent electrode 203, the common electrode 30, the gate electrode 101 and the common electrode line 300.

Figure 9:
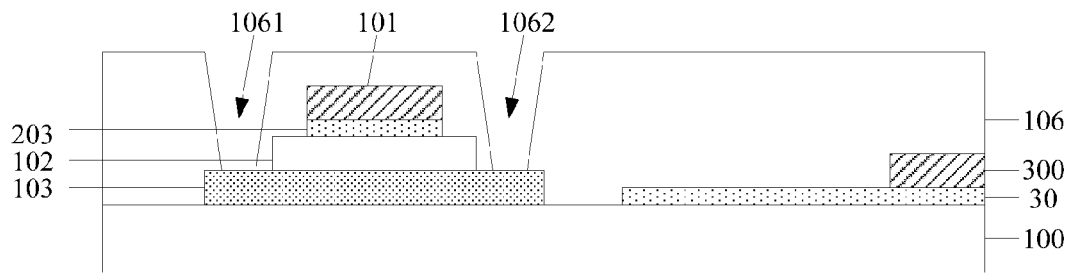
FIG. 9 is a schematic diagram of processes of forming a protection layer according to an embodiment of the present invention.

In step S113, as shown in FIG. 9, the protection layer 106 comprising the first via 1061 and the second via 1062 is formed on the substrate on which the third transparent electrode 203, the common electrode 30, the gate electrode 101 and the common electrode line 300 are formed, by one patterning process; the first via 1061 and the second via 1062 are provided at both sides of the gate insulation layer 102 so as to partially expose the metal oxide semiconductor active layer 103.

Here, a protection layer film with a thickness of 200 nm to 400 nm may be deposited by plasma enhanced chemical vapor deposition process, and then the protection layer 106 comprising the first via 1061 and the second via 1062 is formed by one patterning process.

In this step, the material of the protection layer film is generally silicon nitride, or may utilize one or more of insulation materials such as silicon oxide, silicon oxynitride and aluminum oxide.

Figure 10A:
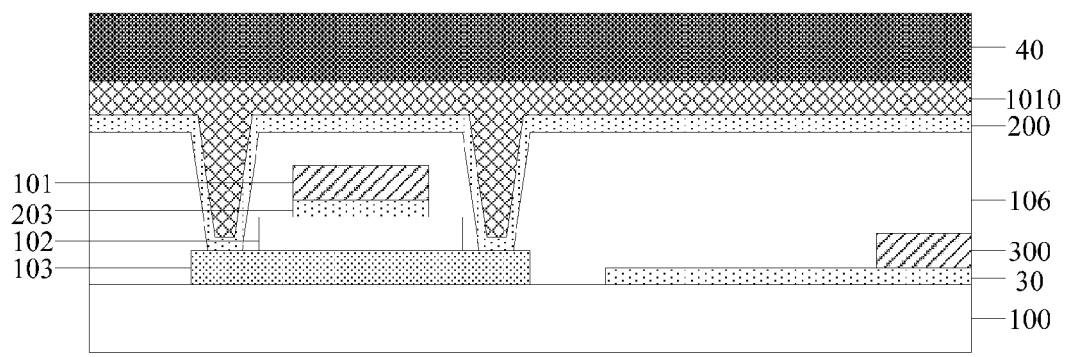
FIGS. 10(a) through 10(e) are schematic diagrams of processes of forming a first transparent electrode, a second transparent electrode, a fourth transparent electrode, a source electrode and a drain electrode according to an embodiment of the present invention.

In step S114, as shown in FIG. 10(a), a layer of transparent conductive film 200 and a layer of metal layer film 1010 are sequentially deposited on the substrate on which the protection layer 106 is formed, and the photoresist 40 is coated on the metal layer film 1010.

Here, a layer of transparent conductive film 200 with a thickness of 30 nm to 50 nm and a layer of metal layer film 1010 with a thickness of 200 nm to 300 nm may be deposited by magnetron sputtering process.

Figure 10B:
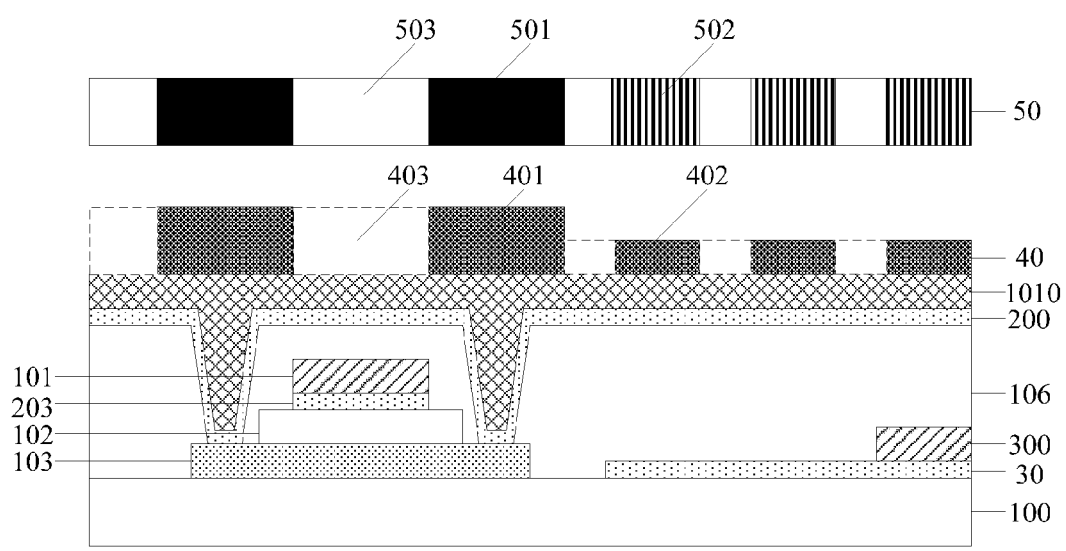

In step S115, as shown in FIG. 10(b), the substrate coated with the photoresist 40 is exposed by using the half-tone mask 50 or gray-tone mask and is then developed, to form a photoresist completely remaining portion 401, a photoresist half remaining portion 402 and a photoresist completely removed portion 403.

In this step, the photoresist completely remaining portion 401 corresponds to the regions of the source electrode 104, the drain electrode 105 and the first transparent electrode 201 and the second transparent electrode 202 provided under the source electrode 104 and the drain electrode 105; the photoresist half remaining portion 402 corresponds to the region of the fourth transparent electrode 204; and the photoresist completely removed portion 403 corresponds to the other regions.

Figure 10C:
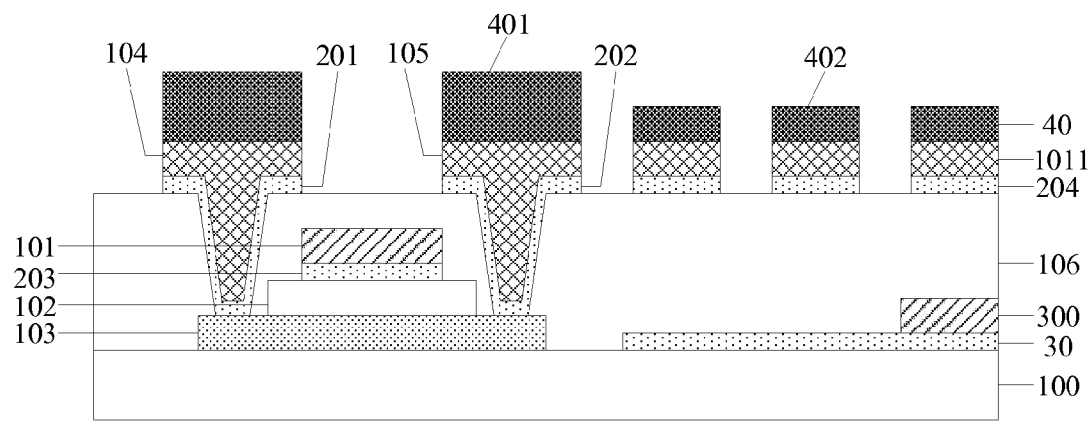

In step S116, as shown in FIG. 10(c), the metal layer film 1010 and the transparent conductive film 200 corresponding to the photoresist completely removed portion 403 are removed by etching process, to form the first transparent electrode 201, the second transparent electrode 202, the fourth transparent electrode 204, the source electrode 104 provided on the first transparent electrode 201, the drain electrode 105 provided on the second transparent electrode 202 and a metal electrode remaining pattern 1011 provided on the fourth transparent electrode 204.

In this step, the fourth transparent electrode 204 is a plurality of electrically connected strip-shaped electrodes, and the fourth transparent electrode 204 and the second transparent electrode 202 together constitute the pixel electrode 20.

Here, wet etching may be performed on the metal layer film 1010 and the transparent conductive film 200.

In addition, a data line may be formed while forming the source electrode 104 and the drain electrode 105.

Figure 10D:
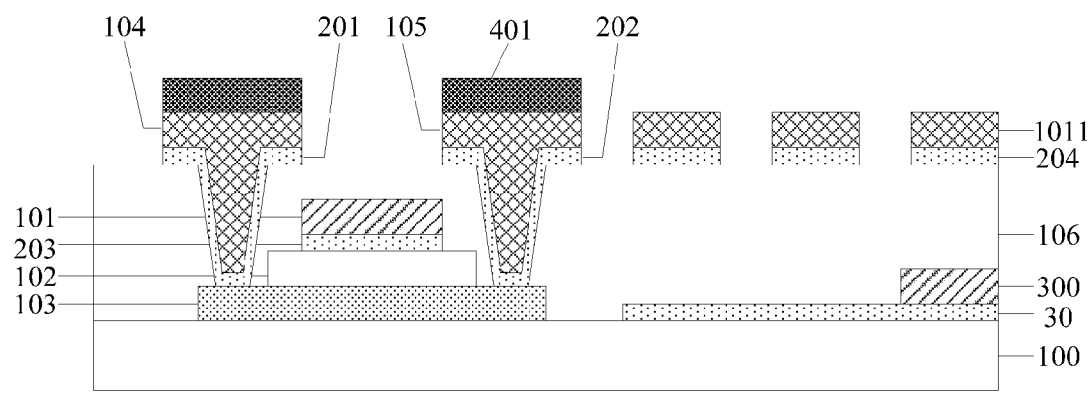

In step S117, as shown in FIG. 10(d), the photoresist 40 of the photoresist half remaining portion 402 is removed by ashing process.

At this point, the metal electrode remaining pattern 1011 corresponding to the photoresist half remaining portion 402 is exposed.

Figure 10E:
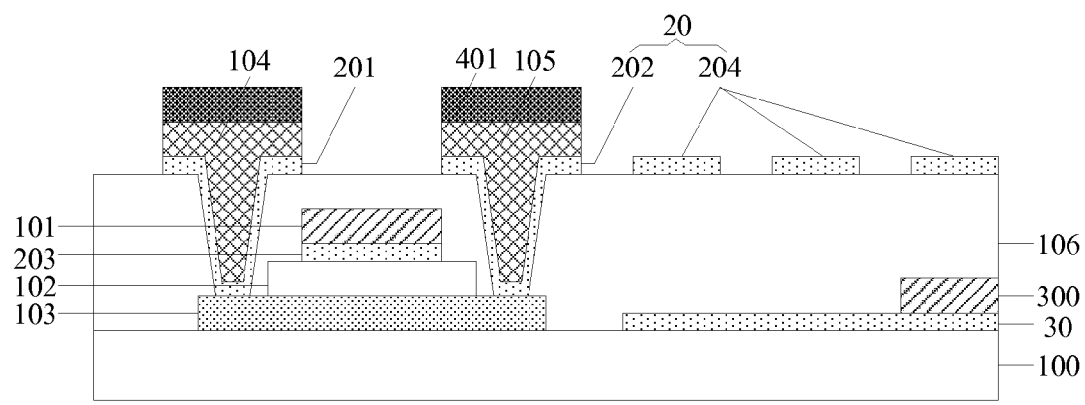

In step S118, as shown in FIG. 10(e), the exposed metal electrode remaining pattern 1011 is removed by etching process.

In step S119, the photoresist 40 of the photoresist completely remaining portion 401 is removed by stripping process, resulting in the array substrate 10 shown in FIG. 4(a).

It can be seen from above steps S101 through S119 that, the advanced super dimension switch type array substrate comprising the metal oxide thin film transistor is fabricated through four patterning processes in the embodiments of the present invention, and the transparent electrodes that can stop diffusion of metal atoms (e.g., copper atoms) are formed between the source electrode 104 and the metal oxide semiconductor active layer 103, between the drain electrode 105 and the metal oxide semiconductor active layer 103, and between the gate electrode 101 and the gate insulation layer 102, thereby not only ensuring the performance of the thin film transistor, but also shortening the manufacturing cycle, reducing the cost and increasing the production capacity.

The above are only exemplary embodiments of the present invention, but the protection scope the present invention is not limited thereto. Modifications and variations conceivable for a person skilled in the art within the technical scope of the disclosure of the present invention are also considered to fall within the protection scope of the present invention.

Therefore, the protection scope of the present invention should be defined by the protection scope of the claims.

The invention claimed is:

1. An array substrate, comprising thin film transistors and pixel electrodes electrically connected to drain electrodes of the thin film transistors, each thin film transistor comprising a gate electrode, a gate insulation layer, a semiconductor active layer, a source electrode, a drain electrode and a protection layer which are provided on a base substrate, wherein the gate electrode, the gate insulation layer and the semiconductor active layer are sequentially provided on the base substrate from bottom to top, the thin film transistor further comprises: a first transparent electrode that is provided between the source electrode and the semiconductor active layer, corresponds to the source electrode and is in direct contact with the source electrode; a second transparent electrode that is provided between the drain electrode and the semiconductor active layer, corresponds to the drain electrode and is in direct contact with the drain electrode; and a third transparent electrode that is provided between the gate insulation layer and the gate electrode, the array substrate further comprises a common electrode line and a common electrode, the common electrode is in direct contact with the common electrode line, the common electrode line and the gate electrode are provided in a same layer, the common electrode and the third transparent electrode are provided in a same layer, wherein the first transparent electrode is in contact with the semiconductor active layer through a first via provided in the protection layer, and the second transparent electrode is in contact with the semiconductor active layer through a second via provided in the protection layer.

2. The array substrate of claim 1, wherein each pixel electrode comprises the second transparent electrode of the thin film transistor and a fourth transparent electrode, the fourth transparent electrode is provided on the same layer as the second transparent electrode and electrically connected to the second transparent electrode, and the fourth transparent electrode comprises a plurality of electrically connected strip-shaped electrodes.

3. The array substrate of claim 1, wherein the common electrode comprises a plate-shaped electrode.

4. The array substrate of claim 1, wherein the semiconductor active layer is a metal oxide semiconductor active layer.

5. The array substrate of claim 1, wherein the first transparent electrode, the second transparent electrode and the third transparent electrode comprise at least one of indium tin oxide, indium zinc oxide and aluminum zinc oxide.

6. A display device, comprising an array substrate, the array substrate comprising thin film transistors and pixel electrodes electrically connected to drain electrodes of the thin film transistors, each thin film transistor comprising a gate electrode, a gate insulation layer, a semiconductor active layer, a source electrode, a drain electrode and a protection layer which are provided on a base substrate, wherein the gate electrode, the gate insulation layer and the semiconductor active layer are sequentially provided on the base substrate from bottom to top, the thin film transistor further comprises: a first transparent electrode that is provided between the source electrode and the semiconductor active layer, corresponds to the source electrode and is in direct contact with the source electrode; a second transparent electrode that is provided between the drain electrode and the semiconductor active layer, corresponds to the drain electrode and is in direct contact with the drain electrode; and a third transparent electrode that is provided between the gate insulation layer and the gate electrode, the array substrate further comprises a common electrode line and a common electrode, the common electrode is in direct contact with the common electrode line, the common electrode line and the gate electrode are provided in a same layer, the common electrode and the third transparent electrode are provided in a same layer, wherein the first transparent electrode is in contact with the semiconductor active layer through a first via provided in the protection layer, and the second transparent electrode is in contact with the semiconductor active layer through a second via provided in the protection layer.

7. The display device of claim 6, wherein each pixel electrode comprises the second transparent electrode of the thin film transistor and a fourth transparent electrode, the fourth transparent electrode is provided on the same layer as the second transparent electrode and electrically connected to the second transparent electrode, and the fourth transparent electrode comprises a plurality of electrically connected strip-shaped electrodes.

8. The display device of claim 6, wherein the common electrode comprises a plate-shaped electrode.

9. The display device of claim 6, wherein the semiconductor active layer is a metal oxide semiconductor active layer.

10. The display device of claim 6, wherein the first transparent electrode, the second transparent electrode and the third transparent electrode comprise at least one of indium tin oxide, indium zinc oxide and aluminum zinc oxide.

* * * * *